(12) United States Patent
Tatum et al.

(10) Patent No.: US 7,270,490 B2
(45) Date of Patent: Sep. 18, 2007

(54) LASER PACKAGE WITH DIGITAL ELECTRONIC INTERFACE

(75) Inventors: Jim Tatum, Plano, TX (US); James K. Guenter, Garland, TX (US)

(73) Assignee: Finisar Corporation, Sunnyvale, CA (US)

( * ) Notice: Subject to any disclaimer, the term of this patent is extended or adjusted under 35 U.S.C. 154(b) by 83 days.

(21) Appl. No.: 11/082,521

(22) Filed: Mar. 17, 2005

(65) Prior Publication Data

US 2006/0045437 A1 Mar. 2, 2006

Related U.S. Application Data

(60) Provisional application No. 60/605,781, filed on Aug. 31, 2004.

(51) Int. Cl.
*G02B 6/36* (2006.01)
*H01S 3/00* (2006.01)
*H01S 3/04* (2006.01)
*H01S 5/00* (2006.01)

(52) U.S. Cl. .......................... 385/92; 385/93; 385/94; 372/38.1; 372/38.01; 372/38.02; 372/38.07; 372/34; 372/50.1; 372/50.21; 372/50.23

(58) Field of Classification Search ............ 385/88–94; 372/38.1, 38.01, 38.02, 38.07, 50.1, 50.21, 372/50.23, 34
See application file for complete search history.

(56) References Cited

U.S. PATENT DOCUMENTS

| 5,542,018 | A  | * | 7/1996  | Kuhara et al. ............... 385/92 |
| 5,844,928 | A  | * | 12/1998 | Shastri et al. ............ 372/38.02 |
| 6,097,748 | A  | * | 8/2000  | Huang et al. .......... 372/50.124 |
| 6,364,541 | B1 | * | 4/2002  | Nesnidal et al. ............. 385/92 |
| 6,742,938 | B2 | * | 6/2004  | Tanaka et al. ................ 385/94 |
| 6,856,769 | B1 | * | 2/2005  | Steffensen et al. ......... 398/135 |
| 7,021,943 | B2 | * | 4/2006  | Kao et al. ..................... 439/67 |

OTHER PUBLICATIONS

"Model 1876 10 Gb/s 1310 nm Transmitter Optical Subassembly with Low-Power Drive Circuit," EMCORE, Jun. 1, 2004, pp. 1-7.

* cited by examiner

*Primary Examiner*—Quyen P Leung
(74) *Attorney, Agent, or Firm*—Workman Nydegger

(57) ABSTRACT

Optical transmission components, systems, and packages where the package includes a common housing containing a laser for transmission of an optical signal, a photodetector optically coupled to the laser for monitoring the laser transmission, and a laser driver electrically coupled to the laser for providing a drive current to the laser. The optical package may be a TO-Can package, the laser may be a vertical cavity surface emitting laser ("VCSEL"), and the laser driver may be an AC modulation laser driver, where a bias current is supplied to the laser from external to the optical transmission component package. An external bias source may be used for providing a bias current to the laser. A temperature sensor located in the laser driver may be used to control operational parameters of the laser.

30 Claims, 8 Drawing Sheets

LASER PACKAGE WITH DIGITAL ELECTRONIC INTERFACE

CROSS-REFERENCE TO RELATED APPLICATIONS

This application claims the benefit of U.S. Provisional Application No. 60/605,781 entitled "Laser with Digital Electronic Interface" filed Aug. 31, 2004.

BACKGROUND OF THE INVENTION

1. The Field of the Invention

The present invention is related generally to optical signal transmission. More specifically, the present invention relates to an optical transmission component comprising a laser, a photodetector, and a laser driver within a common optical package.

2. Related Technology

High-speed communication networks have become of increased importance as the need to transmit large amounts of data continues to rise. Networks employing fiber optic technology are known as optical communications networks, and are typically characterized by high bandwidth and reliable, high-speed data transmission. Many business and governmental entities rely on high-speed communication networks in their day to day operations. As a result, fiber optic technology is increasingly employed in the transmission of data over communications networks.

To communicate over a network using fiber optic technology, fiber optic components such as fiber optic transceivers are used to send and receive optical data. Generally, a fiber optic transceiver can include one or more optical subassemblies ("OSA") such as a transmitter optical subassembly ("TOSA") for sending optical signals, and a receiver optical subassembly ("ROSA") for receiving optical signals. More particularly, the TOSA receives an electrical data signal and converts the electrical data signal into an optical data signal for transmission onto an optical network. The ROSA receives an optical data signal from the optical network and converts the received optical data signal to an electrical data signal for further use and/or processing. Both the ROSA and the TOSA include specific optical components for performing such functions.

In particular, a typical TOSA includes an optical transmitter, such as a laser, for sending an optical signal. Many different types of lasers are known to those skilled in the art. One type of laser referred to as a vertical cavity surface emitting laser ("VCSEL") emits light in a single direction through an upper surface of the laser structure. One common datacom-grade laser diode package for the transmitter is the so-called TO-Can. The TO-Can package comes in a variety of sizes and configurations.

The TOSA may further include a monitor, such as a photodiode, that generates feedback concerning performance parameters of the laser. In certain applications, the laser (e.g., a VCSEL) emission must be monitored to determine whether the power of the emitted light exceeds certain predetermined threshold magnitudes. The monitoring function may be used to avoid any possible danger from OZ the emission of unacceptably high power levels from the laser. The monitoring function may also be necessary in order to maintain required modulation rates and on/off extinction ratios.

Average power techniques may be used to control the power output of the laser. For example, an automatic power-control (APC) feedback loop may be incorporated to maintain a constant average optical output power from the laser over temperature and lifetime. Photodetectors such as, for example, photodiodes, phototransistors, or any other photosensitive component can be used to implement the monitoring function.

A TOSA also typically includes a connection for an external laser driver, which is used to control the operation of the laser. Typically, laser driver circuitry (e.g., for driving a VCSEL) is placed on an external substrate, such as a printed circuit board. However, locating the laser driver circuitry some distance from the corresponding laser can be problematic. For example, signals from the laser driver must travel through traces on the motherboard, electrical interface contacts, leads on the network package, and finally to the laser inside the package potentially causing degradation of the signal and electrical parasitics.

The laser driver circuitry is often designed to compensate for signal degradation and parasitics using methods such as peaking on electrical signals, or use of passive electrical matching networks. Control over electrical parasitics, such as parasitical capacitance, inductance, and resistance, become of increased importance to controlling laser behavior as the data transmission rates increase. That is, at increased data transfer rates smaller parasitics more adversely affect data transmission.

As a result, manufacturers typically rely on after market circuitry and consumers to compensate for degradation, and thus, to optimize performance of the optical transmission component. Removing the need to rely on consumers and external compensation circuitry would enable the manufacturer to more closely tailor the components of the laser driver to accurately compensate for parasitics and signal degradation, and thereby produce a more reliable optical transmission component.

In addition to improving signal quality by reducing signal degradation, it would also be advantageous to be able to more accurately control output characteristics of the laser (e.g. a VCSEL) by controlling operational parameters based on the temperature of the laser. Typically, temperature compensation of a VCSEL is achieved using heat transfer analysis to estimate the heat conduction of the VCSEL and heat transferred from the PC Board up the leads into the package (e.g., a TO-Can package) containing the VCSEL taking into consideration conduction and convection characteristics of the package. Miscalculation of the heat transfer of one or more components can result in overheating of the package potentially damaging the VCSEL, or potentially causing transmission degradation of the data signal transmitted by the VCSEL due to improper temperature compensation.

Some optical packages have used a semiconductor device with a laser and a photodetector in a common housing. Accordingly, this arrangement allows the photodetector to monitor the light intensity emitted by the laser. The laser and photodetector may be produced monolithically or assembled on a common structure, such as a substrate or header, to improve the accuracy of positioning of the various components. This structure can be disposed within a common package having a window through which the emitted light passes. However, existing packages still rely on external laser drivers to power the laser; and estimate laser temperature using heat transfer calculations as discussed above.

Therefore, for the reasons stated above, as well as others, it would be advantageous for an optical transmission component to include a laser, a monitor photodetector, and a laser driver within a common package. It would also be advantageous to use active internal temperature measurement within the common package to provide feedback for controlling output characteristics of the laser.

SUMMARY OF THE INVENTION

The present invention relates to optical transmission components, systems, and packages where the package includes a common housing containing a laser for transmission of an optical signal, a photodetector optically coupled to the laser for monitoring the laser transmission, and a laser driver electrically coupled to the laser for providing a drive current to the laser. According to example embodiments of the present invention, the optical package can be a TO-Can package, the laser can be a vertical cavity surface emitting laser ("VCSEL"), and the laser driver can be a modulation laser driver, where a bias current is supplied to the optical package from external to the optical package. In some embodiments, the optical package is included in optical transmission systems and components.

The present invention further includes a method for controlling operational parameters of a laser in an optical package comprising providing an optical transmission component that includes a laser, a photodetector optically coupled to the laser, a laser driver, including a temperature sensor, electrically coupled to the laser, and a common optical component package containing at least the laser, photodiode, and laser driver. The method further includes controlling an operational parameter of the laser based on an output of the temperature sensor.

Additional features and advantages of the invention will be set forth in the description that follows, and in part will be obvious from the description, or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

In order to describe the manner in which the above-recited and other advantages and features of the invention can be obtained, a more particular description of the invention briefly described above will be rendered by reference to specific embodiments thereof which are illustrated in the appended drawings. Understanding that these drawings depict only typical embodiments of the invention for purposes of explanation and are not therefore to be considered to be limiting of its scope, the invention will be described and explained with additional specificity and detail through the use of the accompanying drawings in which.

DETAILED DESCRIPTION OF THE PREFERRED EMBODIMENTS

The present invention relates to optical transmission components, systems, and packages where the package includes a common housing containing a laser for transmission of an optical signal, a photodetector optically coupled to the laser for monitoring the laser transmission, and a laser driver electrically coupled to the laser for providing a drive current to the laser. According to example embodiments of the present invention, the optical package can be a TO-Can package, the laser can be a vertical cavity surface emitting laser ("VCSEL"), and the laser driver can be a modulation laser driver, where a bias current is supplied to the optical package from external to the optical package. In some embodiments, the optical package is included in optical transmission systems and components.

The present invention further includes a method for controlling operational parameters of a laser in an optical package comprising providing an optical transmission component that includes a laser, a photodetector optically coupled to the laser, a laser driver, including a temperature sensor, electrically coupled to the laser, and a common optical component package containing at least the laser, photodiode, and laser driver. The method further includes controlling an operational parameter of the laser based on an output of the temperature sensor.

The invention is further described with reference to the attached drawings to illustrate the structure and operation of example embodiments used to implement the present invention. Using the diagrams and description in this manner to present the invention should not be construed as limiting its scope. Additional features and advantages of the invention will in part be apparent from the description, including the claims, or may be learned by the practice of the invention.

Figure 1:
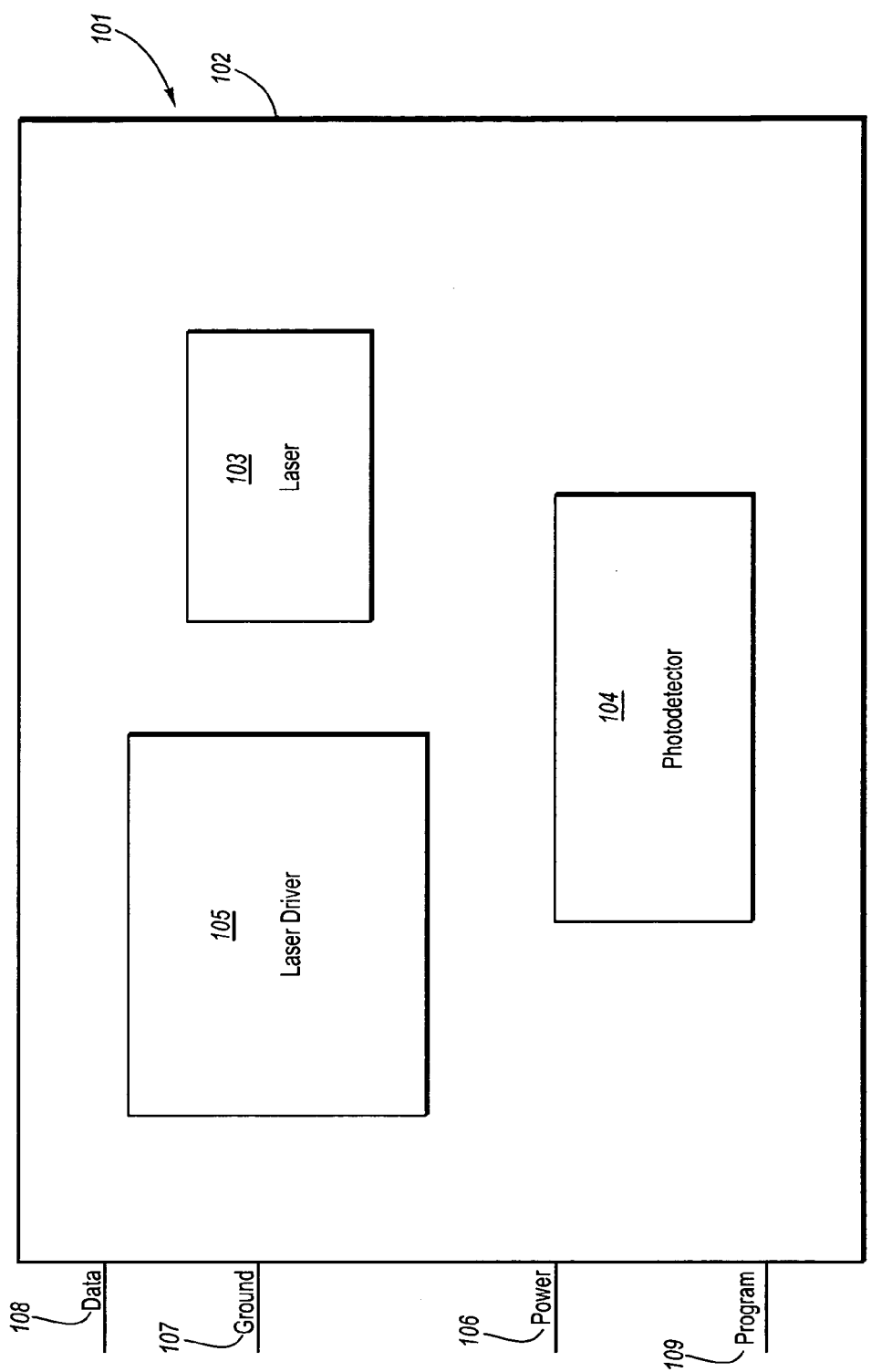
FIG. 1 is an illustration of an optical transmission component according to an example embodiment of the present invention.

Referring to FIG. 1, an illustration of an optical transmission component 101 is shown in accordance with an example embodiment of the present invention. Optical transmission component 101 includes a laser driver 105, a laser 103 and a photodetector 104 (e.g., a photodiode). The laser driver 105, laser 103 and photodetector 104 may be discrete components. Alternatively, the laser 103 and photodetector 104 are both made of semiconductor and may be combined into a common epitaxial design. As shown, the laser driver 105, photodetector 104, and laser 103 are enclosed within a common housing 102.

Laser driver 105 provides a drive current to the laser 103 for transmission of an optical signal. Photodetector 104 is located in the common housing 102 and is optically coupled to the laser so as to receive at least a portion of the optical output of the laser 103. Photodetector 104 provides feedback to the laser driver 105 related to output characteristics of the laser 103.

Referring still to FIG. 1, example electrical connections to the optical transmission component 101 may include a data connection 108, a ground connection 107, a power connection 106, and a program connection 109. The data connection 108 connects to a data transmitting device (e.g., a data processing system) and facilitates the transfer of electrical data signals from the data transmitting device to the optical transmission component 101. Optical transmission component 101 converts the received electrical data signals into corresponding optical data signals for transmission onto an optical communications network by the laser 103. The ground connection 107 connects the optical transmission component 101 to an electrical ground (e.g., a chassis or signal ground). The power connection 106 connects the optical transmission component 101 to an electrical power source. The program connection 109 allows for programming of the laser driver 105. The program connection 109 may be a single wire serial connection, or other appropriate interface.

Embodiments of the present invention include various driving configurations, such as, for example, cathode, anode, or differential connections with biasing internal or external to the optical transmission component 101. In embodiments utilizing external or internal biasing, AC modulation can be implemented in the optical transmission component 101.

Attenuated lens barrels of a transmitter optical subassembly ("TOSA") may be used in combination with optical transmission component 101 such that there may be a single slope efficiency. Thus, the integral lens barrel would have an attenuation to match the optical transmission component so that the driver always has the same current swing at a given temperature. This may be accomplished, for example, by dyes applied to, or incorporated into the lens, or coatings applied to the window of the package constituting a selective filter to accommodate components with different slope efficiencies in assemblies having uniform output characteristics.

Figure 2:
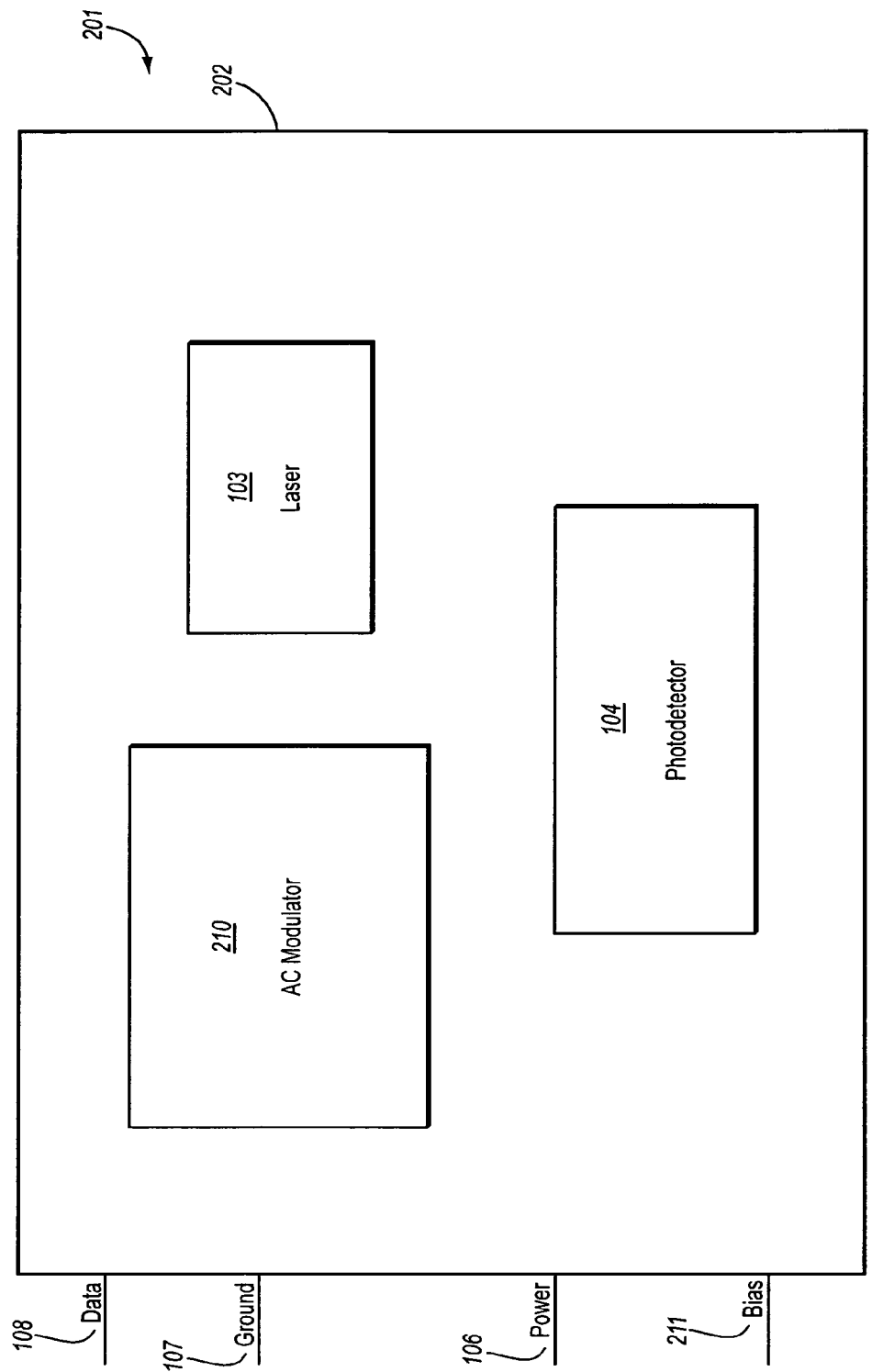
FIG. 2 is an illustration of an optical transmission component where a bias current is supplied to the component from a source external to the optical package according to an example embodiment of the present invention.

Referring now to FIG. 2, a diagram of an optical transmission component is depicted according to an example embodiment of the present invention. Optical transmission component 201 includes an AC modulator 210, a laser 103, and a photodetector 104. AC modulator 210 may add modulation to a bias signal supplied at connection 211 for driving the laser 103. Photodetector 104 is optically coupled to receive a reflected portion of an optical transmission from the laser 103. The photodetector 104 provides feedback to the AC modulator 210 regarding output characteristics of the laser 103. The feedback from the photodetector 104 may be used to control the output of the laser 103. The AC modulator 210, photodetector 104, and laser 103 are enclosed in a common housing 202. The common housing 202 may be any transmitter component housing, such as, for example, a TO-Can component package.

Depicted electrical connections include a data connection 108, a ground connection 107, a power connection 106, and a bias connection 211. Bias connection 211 can be electrically coupled to an external bias driver for supplying a bias current. AC modulator 210 can modulate the supplied bias current for driving the laser 103.

Figure 3:
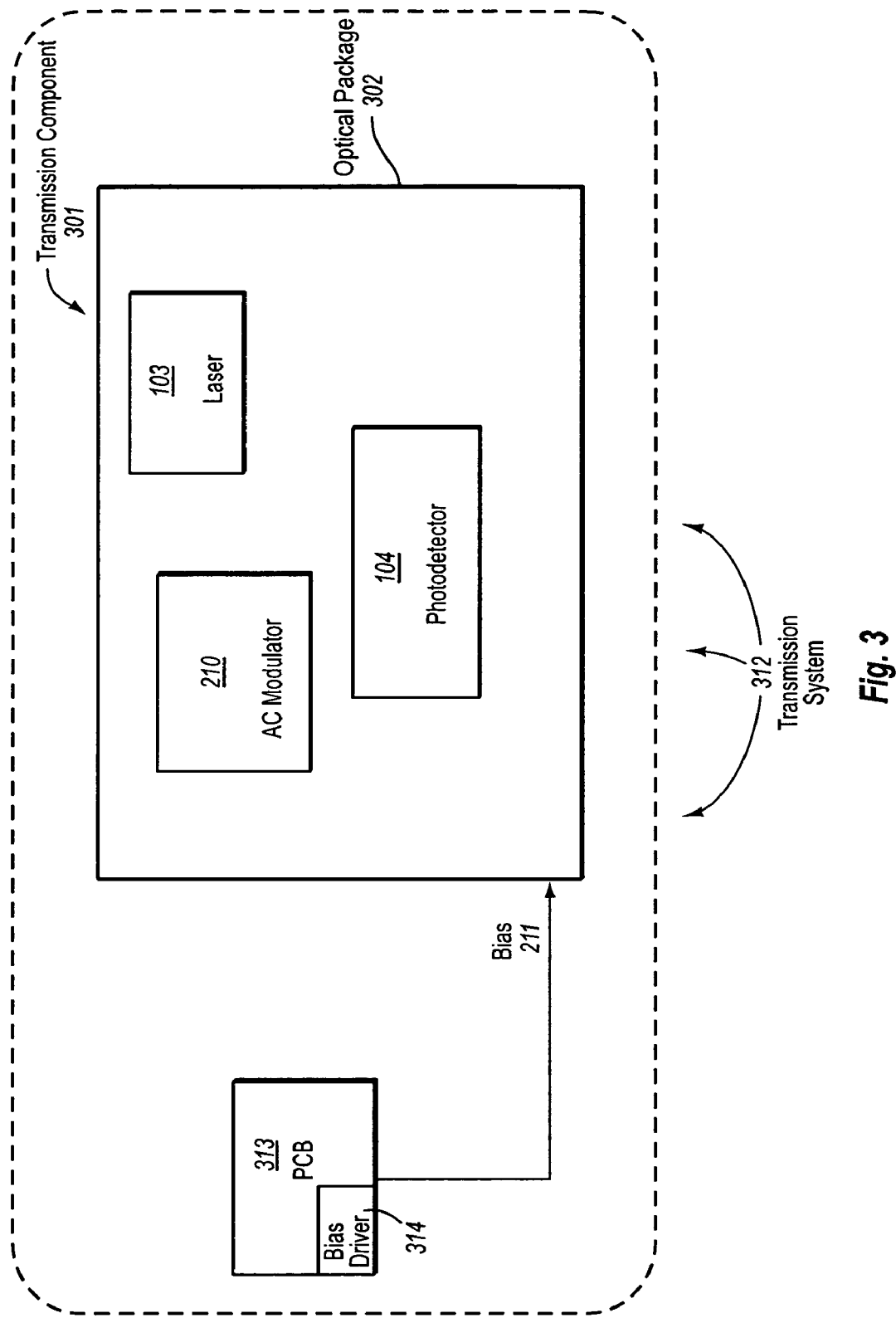
FIG. 3 is an illustration of an optical transmission system according to an example embodiment of the present invention.

Referring now to FIG. 3, an illustration of an optical signal transmission system 312 is depicted according to an example embodiment of the present invention. Optical transmission system 312 includes an optical transmission component 301. Optical transmission component 301 may include an AC modulator 210, laser 103, and a monitor photodetector 104.

As depicted in FIG. 3, bias driver 314 may be located on a Printed Circuit Board ("PCB") 313 that is external to the optical transmission component 301. The PCB is electrically coupled to the optical transmission component 301 by bias current connection 211. Bias driver 314 supplies a bias current to the optical transmission component 301. AC modulator 210 can appropriately add modulation to the bias current supplied to the laser 103.

AC modulator 210, photodetector 104, and laser 103 are enclosed in a common optical package 302. The optical package 302 may be any optical component structure, such as a TO-Can package for example. It should be appreciated that any combination of individual components and systems incorporating the printed circuit board 313 may be used to provide a bias current, whether local or remotely, such as a computer, a microprocessor, or a stand alone circuit.

Figure 4:
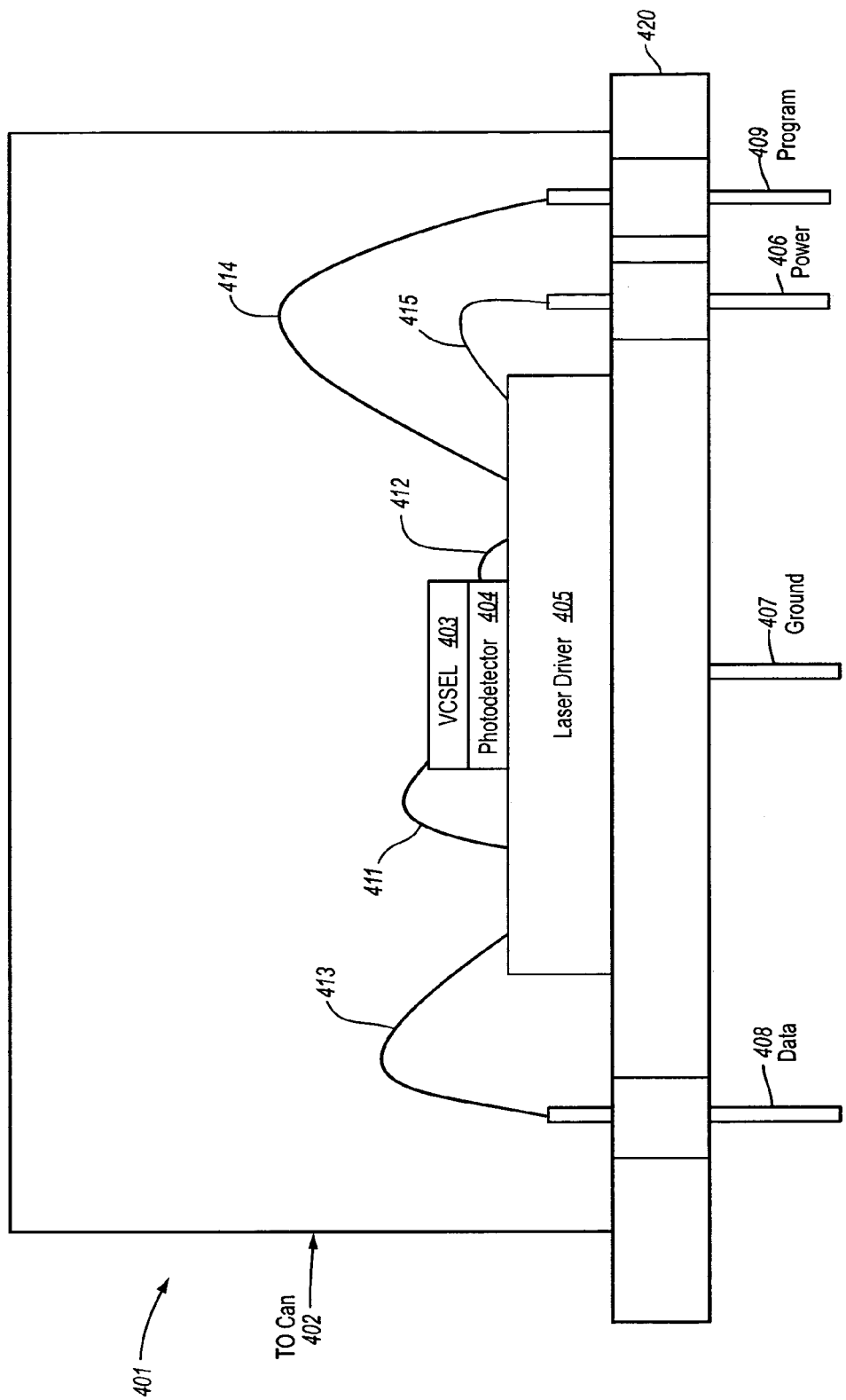
FIG. 4 illustrates an optical signal transmission package according to an example embodiment of the present invention.

With cross-reference to FIGS. 4, 5, 6, and 7, several example embodiments of optical transmission components are illustrated according to the present invention. Referring to FIG. 4, an illustration of an optical transmission component 401 is depicted in accordance with an embodiment of the present invention. The optical transmission component 401 includes a header 420 with a laser driver 405, photodetector 404, and VCSEL 403 located above the header 420. The laser driver 405 may include internal biasing electrically coupled to the VCSEL 403 by connection 411 (e.g., a wire bond) for providing a drive current to the VCSEL 403 to transmit an optical signal. Optical transmission component 401 further comprises a photodetector 404 for monitoring the output of the VCSEL 403 and providing feedback related to the output of the VCSEL 403 to the laser driver 405 using connection 412.

The optical transmission component 401 may include a data connection 408, a ground connection 407, a power connection 406, and a program connection 409. Laser driver 405 is coupled (e.g., by wire bonds) to data connection 408, power connection 406, and program connection 409 by corresponding connections 413, 414, and 415 respectively. The program connection 409 may be a single wire serial connection or other interface. As depicted in FIG. 4, photodetector 404, and VCSEL 403 may be completely discrete components, or may be part of a common epitaxial design enclosed within a TO-Can package 402. In some cases, electrical connections shown in the figures may not be required. For example, electrical connections other than wire bonds may be used, such as, for example, direct solder connections.

Figure 5:
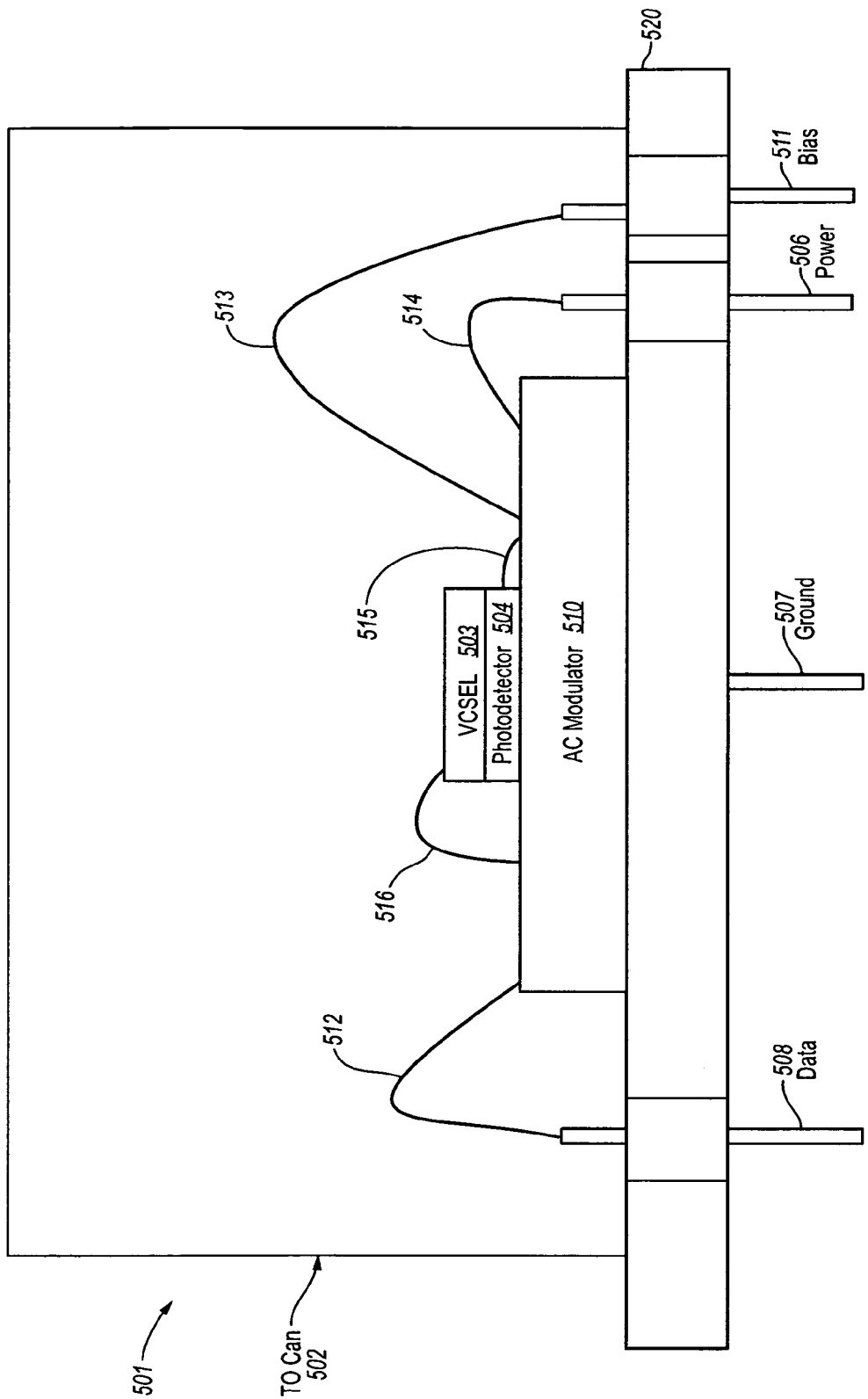
FIG. 5 illustrates an optical signal transmission package wherein a bias current is supplied to the optical package from a source external to the optical package according to an example embodiment of the present invention.

Referring now to FIG. 5, a cross sectional view of an optical transmission component 501 is illustrated according to another example embodiment of the present invention. As shown, optical transmission component 501 includes an AC modulator 510 optically coupled to a VCSEL 503 by electrical connection 516. The AC modulator 510, a photodetector 504, and the VCSEL 503 are located above a header 520. The photodetector 504 is located underneath the VCSEL 503 for monitoring the output of the VCSEL 503. The photodetector 504 provides feedback to AC modulator 510 (or to an external bias circuit) by connection 515 for regulating the output of the VCSEL 503.

Referring still to FIG. 5, optical transmission component 501 may include a data connection 508, a ground connection 507, a power connection 506, and a bias connection 511. AC modulator 510 may be coupled to the data connection 508, the power connection 506, and the bias connection 511 by corresponding connections 512, 514, and 513 respectively (e.g., wire bonds). An externally biased signal (e.g., from the bias driver 314 in FIG. 3) is received at bias connection 511. The AC modulator 510 may add a modulation current to the bias current received by connection 513, which is supplied to the VCSEL 503. The photodetector 504, and the VCSEL 503 may be discrete components, or may be part of a common epitaxial design enclosed within a TO-Can package 502.

Figure 6:
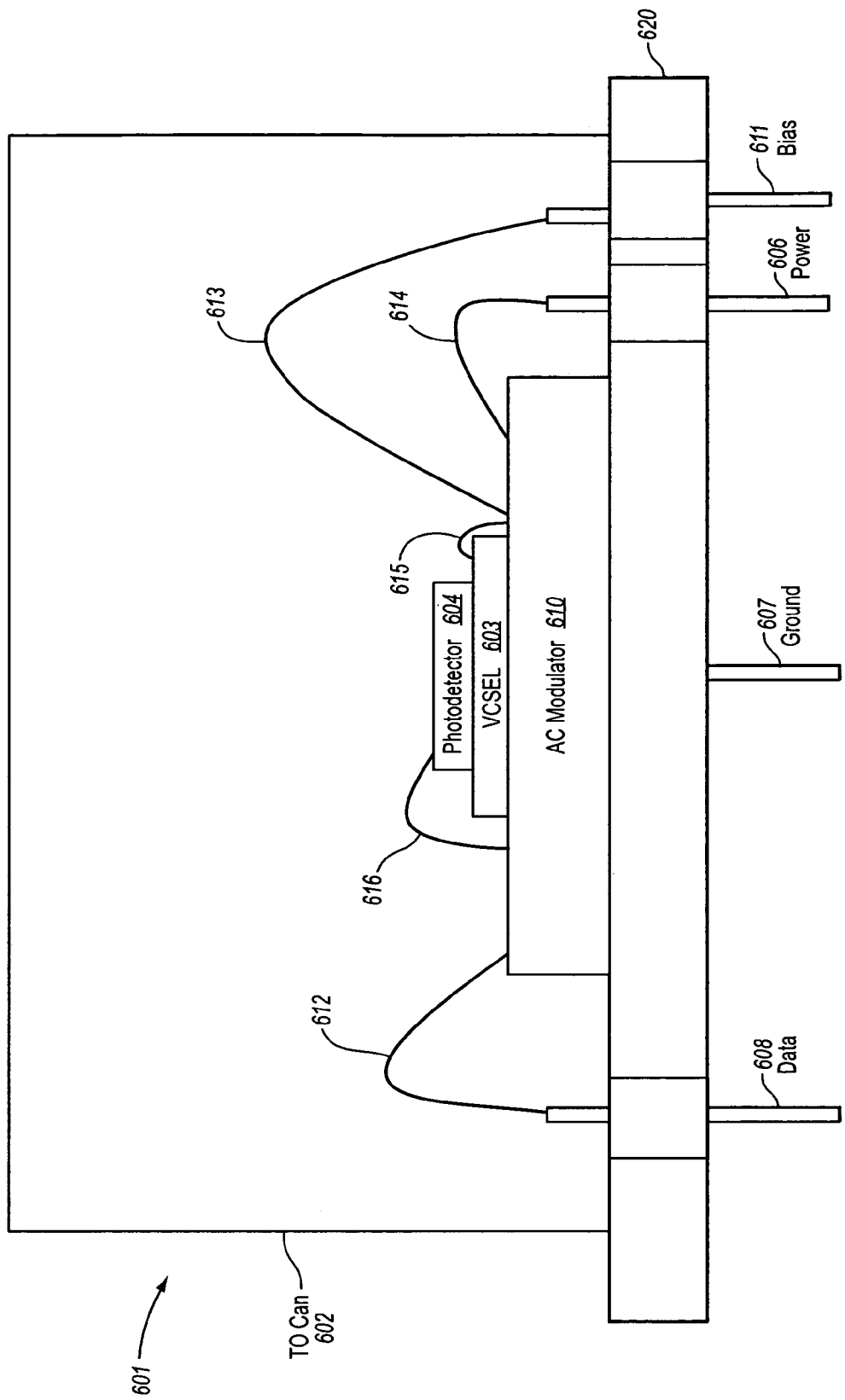
FIG. 6 illustrates another embodiment of an optical transmission package wherein the VCSEL is located underneath the photodetector.

Referring now to FIG. 6, a cross sectional view of an optical transmission component 601 is illustrated in accordance with another embodiment of the present invention. As shown, an AC modulator 610, VCSEL 603, and photodetector 604 are located above a header 620. Optical transmission component 601 is similar to optical transmission component 501, except that the VCSEL 603 is located under the photodetector 604. A portion of the photodetector 604 may be etched or removed to from a cavity so that a portion of the VCSEL is exposed allowing for optical signal transmission. Photodetector 604 monitors the output of the VCSEL 603 in the optical transmission component 601. Connection 616 (e.g., a wire bond) electrically connects AC modulator 610 and photodetector 604 for feedback related to the output of the VCSEL. Connection 615 provides an electrical connection between AC modulator 610 and VCSEL 603.

Referring still to FIG. 6, optical transmission component 601 may include a data connection 608, a ground connection 607, a power connection 606, and a bias connection 611. AC modulator 610 may be coupled to data connection 608, power connection 606, and bias connection 611 by corresponding connections 612, 614, and 613 respectively (e.g., wire bonds). An external bias signal (e.g., from bias driver 314 in FIG. 3) can be received at bias connection 611 and AC modulator may add a modulation current to the bias current.

Figure 7:
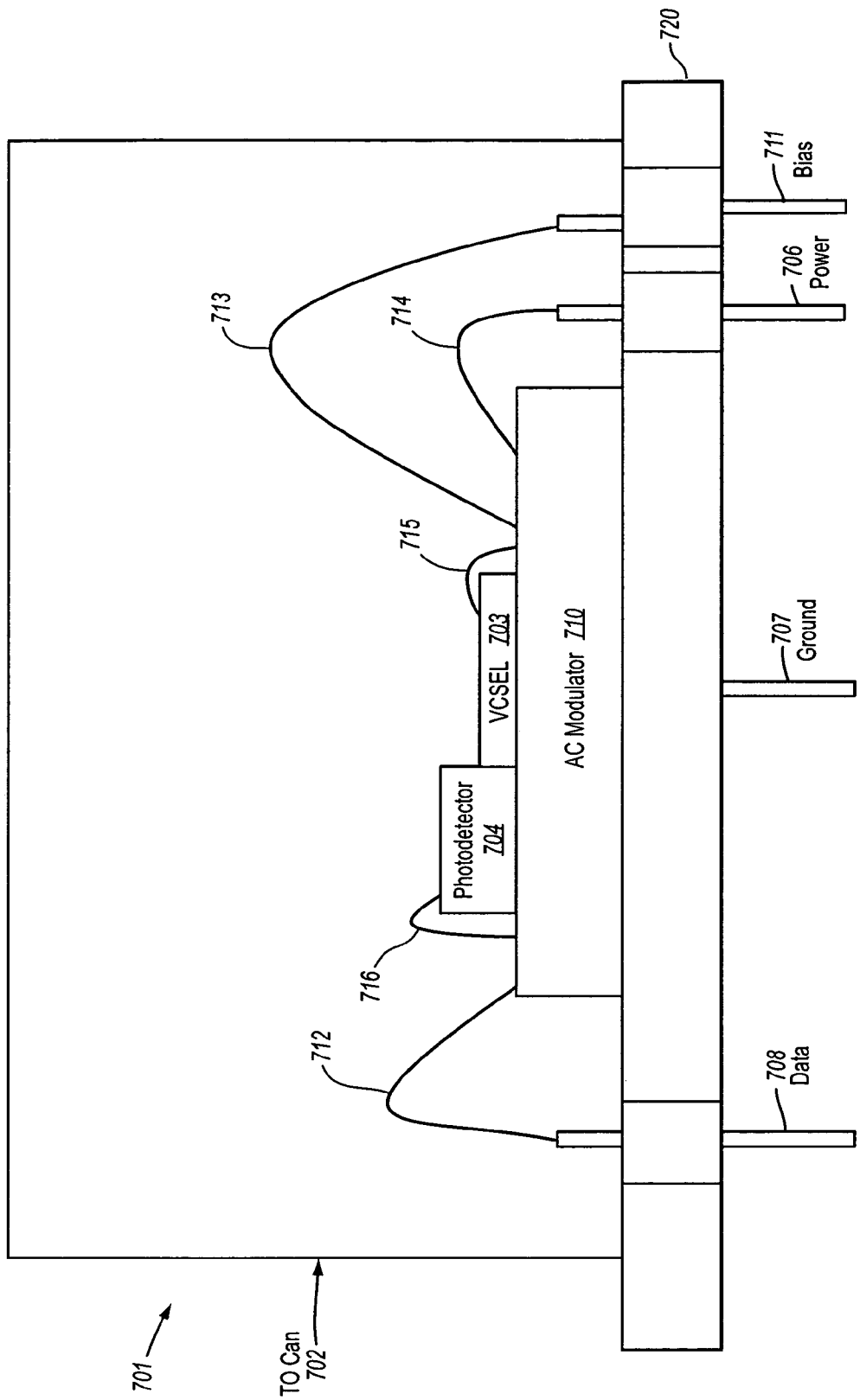
FIG. 7 illustrates another embodiment of an optical transmission package according to the present invention where the VCSEL is located beside the photodetector according to an example embodiment of the present invention.

Referring now to FIG. 7, a cross sectional view of an optical transmission component 701 is illustrated in accordance with another example embodiment of the present invention. Optical transmission component 701 is similar to optical transmission optical components 501 and 601, except that a VCSEL 703 is located next to a photodetector 704. Connection 715 supplies a drive current from the AC modulator 710 to the VCSEL 703. Photodetector 704 monitors the output of the VCSEL 703 in the optical transmission component 701 and provides feedback related to characteristics of the VCSEL to the AC modulator 710 using connection 716. The AC modulator 710, photodetector 704, and VCSEL 703 are located above a header 720.

As depicted in FIG. 7, optical transmission component 701 includes a data connection 708, a ground connection 707, a power connection 706, and a bias connection 711. AC modulator 710 is coupled to data connection 708, power connection 706, and bias connection 711 by corresponding connections 712, 714, and 713 respectively (e.g., wire bonds). An external bias signal (e.g., from bias driver 314 in FIG. 3) can be received at bias connection 711. As described above, the photodetector 704, and the VCSEL 703 can be entirely discrete components, or may be part of a common epitaxial design enclosed within a common TO-Can package 702.

It should be understood that the embodiments depicted in FIGS. 4, 5, 6, 7 are merely example embodiments of the present invention. It would be apparent to one skilled in the art, after having reviewed this description that a large number of different configurations and embodiments, in addition to those expressly described, are possible and included within the scope of the present invention.

With reference to FIGS. 4, 5, 6, and 7 example embodiments are illustrated wherein a photodetector and a VCSEL are located on top of a laser driver. The laser driver may include a temperature sensor for temperature compensation. Accordingly, the relationship of the temperature between the VCSEL and the laser driver will be apparent and can be used as feedback when generating an optical signal using the VCSEL. Therefore, mounting the VCSEL on top of a laser driver may facilitate active monitoring of the temperature of the laser driver, which may be used to control operational parameters of the VCSEL (e.g. power supplied to the VCSEL and extinction ratio).

An additional advantage of mounting the VCSEL on top of a laser driver is that the VCSEL may operate hotter that it would otherwise operate. Running the VCSEL at higher temperatures may improves the relaxation oscillation frequency of the VCSEL (which improves as temperature increases).

Figure 8:
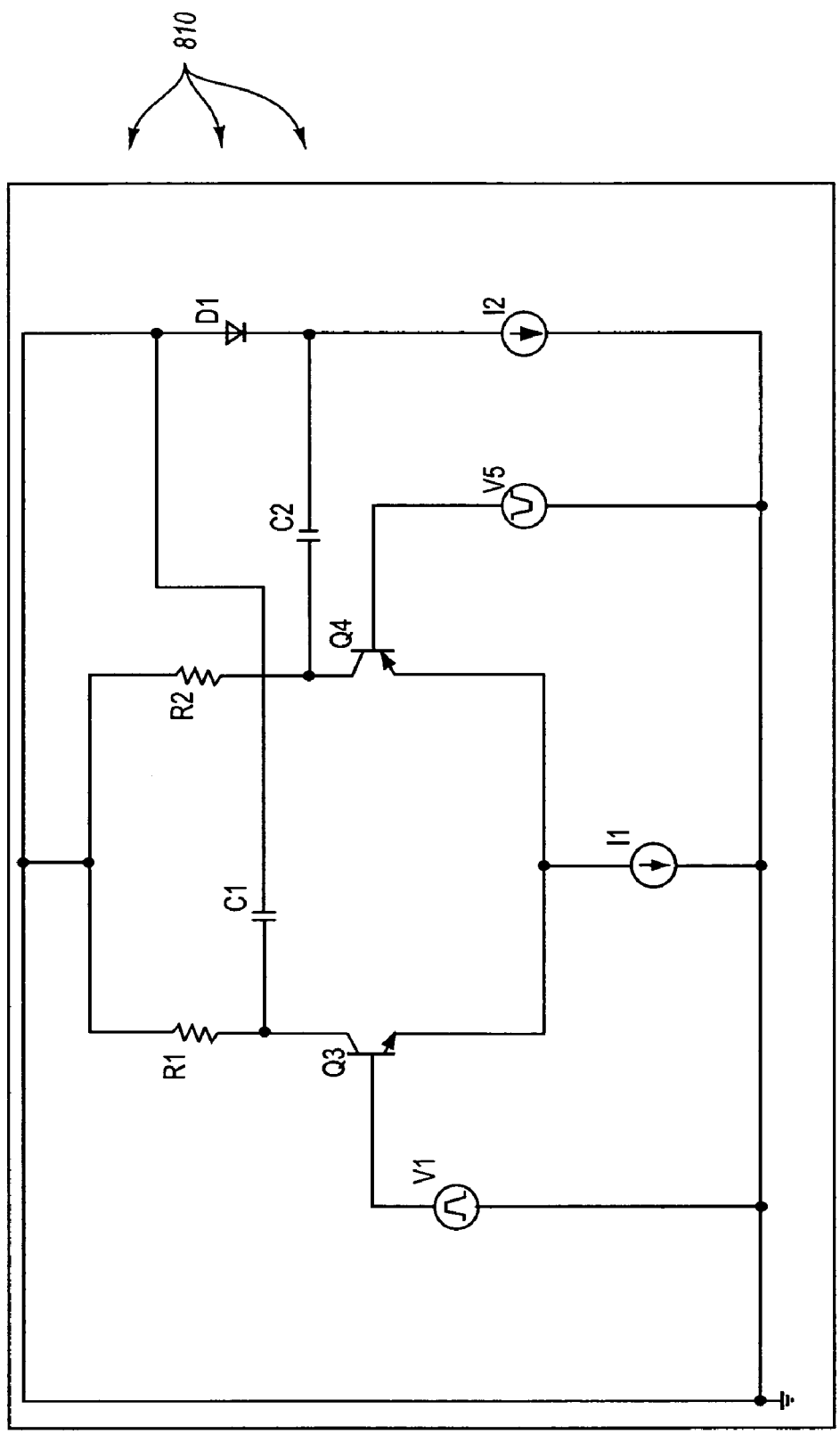
FIG. 8 depicts a circuit diagram illustrating an example circuit for providing a modulation drive current to a VCSEL.

Referring now to FIG. 8, an example AC modulation drive circuit 810 is shown according to an example embodiment of the present invention. As shown in FIG. 8, the modulation drive circuit 810 may be as simple as possible with only two active components (transistors Q3 and Q4). As a result, additional active components may be added to the modulation drive circuit 810 without significantly complicating the circuit. For example, capacitors may be added so that discrete capacitors are not required. Because these components are internal to the optical component package they are controlled by the manufacturer, and as a result compensation for parasitics may also be controlled by the manufacturer. Another potential benefit is that poor quality signals that may have been distorted or degraded may be substantially improved (i.e. cleaned up) by the internal differential pair of transistors (Q3 and Q4) included in modulation drive circuit 810, thereby providing internal compensation for signal degradation. For example, in some embodiments, the internal differential pair is used to improve (i.e. square up) digital signals.

The invention may be embodied in other specific forms without departing from its spirit or essential characteristics. The described example embodiments and specific features are to be considered in all respect only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A TO-Can optical package comprising:
   a laser for transmission of an optical signal;
   a photodetector optically coupled to the laser for monitoring the optical signal transmission;
   a laser driver electrically coupled to the laser for providing a drive current to the laser; and
   a TO-Can housing containing at least the laser, photodetector, and laser driver, wherein the laser driver is a modulation laser driver and a bias current is supplied to the TO-Can optical package from a current source that is external to the TO-Can optical package.

2. The TO-Can optical package of claim 1, further comprising a header, wherein the laser, photodetector, and laser driver are located above the header.

3. The TO-Can optical package of claim 1, wherein the laser is a vertical cavity surface emitting laser ("VCSEL").

4. The TO-Can optical package of claim 1, wherein the arrangement of the laser and photodetector within the common housing is according to at least one of the following arrangements:
   the laser is disposed over the photodetector;
   the laser and the photodetector are placed in a side by side arrangement within the common housing;

the photodetector is disposed over the laser;
the photodetector is disposed over the laser and a portion of a photosensitive layer of the photodetector is etched to form a cavity which exposes at least a portion of the laser;
the photodetector and the laser are both disposed over the laser driver;
the laser and the photodetector are epitaxially formed on a common substrate; and
the laser, laser driver, and photodetector are all distinct components contained within the optical component package.

5. A transceiver comprising a transmitter optical subassembly ("TOSA") including the TO-Can optical package of claim 1 and a receiver optical subassembly (ROSA).

6. The TO-Can optical package of claim 1, wherein the laser driver includes a sensor for measuring the temperature of the laser driver.

7. The TO-Can optical package of claim 6, further comprising circuitry for controlling at least one operational parameter of the laser based on the measured temperature of the laser driver.

8. The TO-Can optical package of claim 7, wherein the operational parameter controlled is the power supplied to the laser.

9. An optical package comprising:
a laser for transmission of an optical signal;
a photodetector optically coupled to the laser for monitoring the optical signal transmission;
a laser driver electrically coupled to the laser for providing a drive current to the laser; and
a common housing containing at least the laser, photodetector, and laser driver, wherein a single wire serial interface is used to program the laser driver.

10. A TO-Can optical package comprising:
a laser for transmission of an optical signal;
a photodetector optically coupled to the laser for monitoring the optical signal transmission;
a laser driver electrically coupled to the laser for providing a drive current to the laser, wherein the laser driver includes a sensor for measuring the temperature of the laser driver; and
a TO-Can housing containing at least the laser, photodetector, and laser driver.

11. The TO-Can optical package of claim 10, further comprising circuitry for controlling at least one operational parameter of the laser based on the measured temperature of the laser driver.

12. The TO-Can optical package of claim 11, wherein the operational parameter controlled is the power supplied to the laser.

13. An optical transmission assembly comprising:
an optical package comprising:
  a laser for transmission of an optical signal;
  a photodetector optically coupled to the laser for monitoring the optical signal transmission;
  a laser driver electrically coupled to the laser for providing a drive current to the laser; and
  a common housing containing at least the laser, photodetector, and laser driver; and
an integral lens barrel optically coupled to the optical package for focusing optical signals generated by the laser, the integral lens barrel having built in attenuation for controlling the slope efficiency of the optical package.

14. The optical transmission assembly of claim 13, wherein the integral lens barrel has an attenuation that matches the optical package so that the laser driver has the same current swing at a given temperature.

15. An optical signal transmission system for transmitting an optical signal, the system comprising:
a transmit optical subassembly ("TOSA"), comprising:
  a laser;
  a photodetector configured to provide feedback describing an optical transmission of the laser;
  a modulation current source electrically coupled to the laser;
  a bias current connection electrically coupled to the modulation current source; and
  a common optical component package containing at least the laser, photodetector, and modulation current source; and
a bias current source located external to the common optical component package and coupled to the bias current connection, wherein the bias current source is configured to provide a bias current to the laser.

16. The system of claim 15, wherein the bias current source is located on a printed circuit board that is located externally to the TOSA.

17. The system of claim 15, wherein the laser is a vertical cavity surface emitting laser ("VCSEL").

18. The system of claim 15, wherein the common optical component package is a TO-Can package.

19. The system of claim 15, wherein the modulation current source further comprises a temperature sensor and the output of the temperature sensor is used to control at least one operational parameter of the laser.

20. An optical signal transmission system for transmitting an optical signal, the system comprising:
a transmit optical subassembly ("TOSA"), comprising:
  a laser;
  a photodetector configured to provide feedback describing an optical transmission of the laser;
  a modulation current source electrically coupled to the laser;
  a bias current connection electrically coupled to the modulation current source;
  a common optical component package containing at least the laser, photodetector, and modulation current source; and
  a single wire serial interface connected to a printed circuit board that is used to program the modulation current source; and
a bias current source located external to the common package and coupled to the bias current connection, wherein the bias current source is configured to provide a bias current to the laser.

21. A method for controlling operational parameters of a laser in an optical transmission component, the method comprising:
providing the optical transmission component, wherein the optical transmission component comprises:
  a laser, wherein the laser is a vertical cavity surface emitting laser ("VCSEL");
  a photodetector optically coupled to the laser;
  a laser driver electrically coupled to the laser, the laser driver including a temperature sensor;
  an interface for programming the laser driver; and
  a common optical component package containing at least the laser, the photodetector, and the laser driver;
programming the laser driver via the interface; and
controlling an operational parameter of the laser based on the programming and an output of the temperature sensor.

22. The method of claim 21, wherein the operational parameter of the laser comprises at least one of a current supplied to the laser and an extinction ratio of the laser.

23. The method of claim 21, farther comprising controlling an operational parameter of the laser based on an output of the photodetector.

24. A method for controlling operational parameters of a laser in an optical transmission component, the method comprising:
providing the optical transmission component, wherein the optical transmission component comprises:
a laser;
a photodetector optically coupled to the laser;
a laser driver electrically coupled to the laser, the laser driver including a temperature sensor, wherein the laser driver is an AC modulator and a bias current is supplied to the optical transmission component from external to the optical transmission component;
an interface for programming the laser driver; and
a common optical component package containing at least the laser, the photodetector, and the laser driver;
programming the laser driver via the interface; and
controlling an operational parameter of the laser based on the programming and an output of the temperature sensor.

25. A TO-Can optical package comprising:
a laser for transmission of an optical signal;
a photodetector optically coupled to the laser for monitoring the optical signal transmission;
a laser driver electrically coupled to the laser for providing a drive current to the laser, wherein the laser driver includes only two active components; and
a TO-Can housing containing at least the laser, photodetector, and laser driver.

26. A TO-Can optical package comprising:
a laser for transmission of an optical signal;
a photodetector optically coupled to the laser for monitoring the optical signal transmission;
a laser driver electrically coupled to the laser for providing a drive current to the laser, wherein the laser driver includes a differential pair of transistors configured to compensate for signal degradation; and
a TO-Can housing containing at least the laser, photodetector, and laser driver.

27. An optical package comprising:
a laser for transmission of an optical signal;
a photodetector optically coupled to the laser for monitoring the optical signal transmission;
a laser driver electrically coupled to the laser for providing a drive current to the laser, wherein the laser is disposed over the laser driver; and
a common housing containing at least the laser, photodetector, and laser driver.

28. The optical package of claim 27, wherein the mounting the laser on top of the laser driver facilitates active monitoring of a temperature.

29. The optical package of claim 27, wherein the mounting the laser on top of the laser driver increases an operation temperature of the laser.

30. The optical package of claim 27, wherein the photodetector is disposed over the laser driver.

* * * * *